(12) United States Patent
Lu

(10) Patent No.: US 11,239,277 B2
(45) Date of Patent: Feb. 1, 2022

(54) DISPLAY PANEL, MANUFACTURING METHOD OF SAME, AND TILED DISPLAY PANEL

(71) Applicant: Shenzhen China Star Optoelectronics Semiconductor Display Technology Co., Ltd., Shenzhen (CN)

(72) Inventor: Macai Lu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 128 days.

(21) Appl. No.: 16/624,929

(22) PCT Filed: Nov. 15, 2019

(86) PCT No.: PCT/CN2019/118880
§ 371 (c)(1),
(2) Date: Dec. 20, 2019

(87) PCT Pub. No.: WO2021/082092
PCT Pub. Date: May 6, 2021

(65) Prior Publication Data
US 2021/0225928 A1    Jul. 22, 2021

(30) Foreign Application Priority Data

Oct. 30, 2019  (CN) .......................... 201911042705.9

(51) Int. Cl.
*H01L 27/15* (2006.01)
*H01L 33/62* (2010.01)
(Continued)

(52) U.S. Cl.
CPC .............. *H01L 27/156* (2013.01); *G09F 9/33* (2013.01); *H01L 33/005* (2013.01);
(Continued)

(58) Field of Classification Search
CPC ...... H01L 27/156; H01L 33/62; H01L 27/323
See application file for complete search history.

(56) References Cited

U.S. PATENT DOCUMENTS

| 2011/0057861 A1* | 3/2011 | Cok | .................... H01L 51/5209 |
| | | | 345/1.3 |
| 2015/0091012 A1 | 4/2015 | Namkung et al. | |

(Continued)

FOREIGN PATENT DOCUMENTS

| CN | 108766981 | 11/2018 |
| CN | 110164901 | 8/2019 |
| CN | 110503898 | 11/2019 |

*Primary Examiner* — Bradley Smith
*Assistant Examiner* — David J Goodwin

(57) ABSTRACT

A display panel comprises: an array substrate comprising a display area and a trace area located around the display area; a light-emitting layer located in the display area and electrically connected to a first side of the array substrate; a fanout circuit located in the trace area; a fanout circuit base layer disposed between the fanout circuit and the array substrate; and a driver chip located at a second side of the array substrate; wherein the fanout circuit and the fanout circuit base layer are bent from the first side to the second side along a sidewall of the array substrate, the fanout circuit is electrically connected to the array substrate at the first side, and the fanout circuit is electrically connected to the driver chip at the second side.

12 Claims, 6 Drawing Sheets

(51) Int. Cl.
    *G09F 9/33*     (2006.01)
    *H01L 33/00*     (2010.01)
    *H01L 33/48*     (2010.01)

(52) U.S. Cl.
    CPC ............ *H01L 33/486* (2013.01); *H01L 33/62* (2013.01); *G09G 2360/04* (2013.01); *H01L 2933/0066* (2013.01)

(56) References Cited

U.S. PATENT DOCUMENTS

| | | | |
|---|---|---|---|
| 2019/0095007 A1* | 3/2019 | Jeong | G06F 3/0446 |
| 2019/0363268 A1 | 11/2019 | Xu et al. | |
| 2020/0006680 A1* | 1/2020 | Fang | H01L 51/0097 |
| 2020/0091446 A1* | 3/2020 | Seo | H01L 51/5253 |
| 2020/0365623 A1* | 11/2020 | Chien | G02F 1/13452 |
| 2021/0191552 A1* | 6/2021 | Bok | G06F 3/0443 |
| 2021/0263606 A1* | 8/2021 | Lee | G06F 3/0443 |

\* cited by examiner

DISPLAY PANEL, MANUFACTURING METHOD OF SAME, AND TILED DISPLAY PANEL

RELATED APPLICATIONS

This application is a National Phase of PCT Patent Application No. PCT/CN2019/118880 having International filing date of Nov. 15, 2019, which claims the benefit of priority of Chinese Patent Application No. 201911042705.9 filed on Oct. 30, 2019. The contents of the above applications are all incorporated by reference as if fully set forth herein in their entirety.

FIELD AND BACKGROUND OF THE INVENTION

The present disclosure relates to the display field, and particularly relates to a display panel, a manufacturing method of same, and a tiled display panel.

In the display field, bezel-free displays or narrow-bezel displays have gradually become mainstream. As for displays, such as liquid crystal displays (LCDs), organic light-emitting diode displays (OLEDs), and light emitting diode displays (LEDs), the larger the screen size, the higher the manufacturing difficulty and the manufacturing cost per unit area. Therefore, large-size displays are usually formed by tiling a plurality of small or medium-sized displays. The existence of bezels of the small or medium-sized displays will lead to presence of bar shaped seams in display areas of tiled display panels, thus lowering display quality.

SUMMARY OF THE INVENTION

In view of this, the present disclosure aims to provide a bezel-free or narrow-bezel display panel and a manufacturing method of the same. Besides, the present disclosure also provides a tiled display panel which can eliminate or reduce seams.

A display panel, comprises:

an array substrate comprising a display area and a trace area located around the display area;

a light-emitting layer located in the display area and electrically connected to a first side of the array substrate;

a fanout circuit located in the trace area;

a fanout circuit base layer disposed between the fanout circuit and the array substrate; and a driver chip located at a second side of the array substrate;

wherein the fanout circuit and the fanout circuit base layer is bent from the first side to the second side along a sidewall of the array substrate, the fanout circuit is electrically connected to the array substrate at the first side, and the fanout circuit is electrically connected to the driver chip at the second side.

In a display panel according to the present disclosure, the fanout circuit comprises a connecting portion, a bending portion and a bonding portion, the connecting portion is located at the first side and is electrically connected to the array substrate, the bending portion covers the sidewall of the array substrate, and the bonding portion is located at the second side and the bonding portion is electrically connected to the driver chip.

In a display panel according to the present disclosure, the array substrate comprises:

a base substrate;

a thin film transistor layer located on the base substrate;

a pixel electrode layer disposed on the thin film transistor layer, wherein the pixel electrode layer comprises a pixel electrode, a common electrode and a connecting electrode, and the common electrode is electrically connected to the connecting electrode, and the pixel electrode is electrically connected to the thin film transistor layer; and the light-emitting layer and the fanout circuit located on the pixel electrode layer, wherein the light-emitting layer is electrically connected to the pixel electrode and the common electrode, and the connecting portion of the fanout circuit is electrically connected to the connecting electrode.

In a display panel according to the present disclosure, the thin film transistor layer comprises a plurality of thin film transistors, a plurality of gate lines connecting to a gate electrode of the plurality of thin film transistors, and a plurality of source/drain lines connecting to a source/drain electrode of the plurality of thin film transistors, wherein the connecting electrode is electrically connected to the gate lines and the source/drain lines.

In a display panel according to the present disclosure, the pixel electrode is electrically connected to the source electrode or the drain electrode of the thin film transistors.

In a display panel according to the present disclosure, at least one through-hole is formed on the fanout circuit base layer.

In a display panel according to the present disclosure, the light-emitting layer comprises a micro light emitting diode.

A manufacturing method of a display panel, comprises the steps of:

a fanout circuit forming step of providing an array substrate, wherein the array substrate comprises a sacrificial metal layer, the sacrificial metal layer is disposed on a trace area of the array substrate, forming a fanout circuit base layer on a first side of the array substrate, forming a fanout circuit on the fanout circuit base layer;

a sacrificial layer removing step of etching and removing the sacrificial metal layer;

a light-emitting layer and diver chip bonding step of bonding a light-emitting layer at the first side, and bonding a driver chip at the bonding portion wherein the light-emitting layer is electrically connected to the array substrate;

a substrate cutting step of cutting off a portion of the array substrate which is located under the bending portion; and a fanout circuit bending step of bending the fanout circuit base layer, the fanout circuit and the driver chip to a second side of the array substrate.

In a manufacturing method of a display panel according to the present disclosure, the fanout circuit comprises a connecting portion, a bending portion and a bonding portion, the connecting portion is located at the first side and electrically connected to the array substrate, the bending portion covers the sidewall of the array substrate, and the bonding portion is located at the second side and the bonding portion is electrically connected to the driver chip.

In a manufacturing method of a display panel according to the present disclosure, the fanout circuit forming step comprises a step of forming at least one through-hole on the fanout circuit base layer, the sacrificial metal layer removing step comprises a step of etching the sacrificial metal layer via the through-hole.

In a manufacturing method of a display panel according to the present disclosure, the substrate cutting step is conducted before the sacrificial metal layer removing step, the sacrificial metal layer is exposed by the substrate cutting step, the sacrificial metal layer is removed by the sacrificial metal layer removing step.

In a manufacturing method of a display panel according to the present disclosure, the array substrate comprises:
a base substrate;
a thin film transistor layer located on the base substrate;
a pixel electrode layer disposed on the thin film transistor layer, wherein the pixel electrode layer comprises a pixel electrode, a common electrode and a connecting electrode, the common electrode is electrically connected to the connecting electrode, and the pixel electrode is electrically connected to the thin film transistor layer;
the light-emitting layer and the fanout circuit is located on the pixel electrode layer, wherein the light-emitting layer is electrically connected to the pixel electrode and the common electrode, a connecting portion of the fanout circuit is electrically connected to the connecting electrode.

A tiled display panel have a plurality of display panels, wherein the plurality of display panels are tightly arranged in a matrix, the display panel comprises:
an array substrate comprising a display area and a trace area located around the display area;
a light-emitting layer located in the display area, and electrically connected to a first side of the array substrate;
a fanout circuit located in the trace area;
a fanout circuit base layer disposed between the fanout circuit and the array substrate; and
a driver chip located at a second side of the array substrate;
wherein the fanout circuit and the fanout circuit base layer are bent from the first side to the second side along a sidewall of the array substrate, the fanout circuit is electrically connected to the array substrate at the first side, and the fanout circuit is electrically connected to the driver chip at the second side.

In a tiled display panel according to the present disclosure, the fanout circuit comprises a connecting portion, a bending portion and a bonding portion, the connecting portion is located at the first side and is electrically connected to the array substrate, the bending portion covers the sidewall of the array substrate, and the bonding portion is located at the second side and the bonding portion is electrically connected to the driver chip.

In a tiled display panel according to the present disclosure, the array substrate comprises:
a base substrate;
a thin film transistor layer located on the base substrate;
a pixel electrode layer disposed on the thin film transistor layer, wherein the pixel electrode layer comprises a pixel electrode, a common electrode and a connecting electrode, and the common electrode is electrically connected to the connecting electrode, and the pixel electrode is electrically connected to the thin film transistor layer; and
the light-emitting layer and the fanout circuit located on the pixel electrode layer, wherein the light-emitting layer is electrically connected to the pixel electrode and the common electrode, and the connecting portion of the fanout circuit is electrically connected to the connecting electrode.

In a tiled display panel according to the present disclosure, the thin film transistor layer comprises a plurality of thin film transistors, a plurality of gate lines connecting to a gate electrode of the plurality of thin film transistors, and a plurality of source/drain lines connecting to a source/drain electrode of the plurality of thin film transistors, the connecting electrode is electrically connected to the gate lines and the source/drain lines.

In a tiled display panel according to the present disclosure, the pixel electrode is electrically connected to the source electrode or the drain electrode of the thin film transistor.

In a tiled display panel according to the present disclosure, at least one through-hole is formed on the fanout circuit base layer.

A fanout circuit and a fanout circuit base layer of a display panel are disposed on a surface of the array substrate according to one embodiment of the present disclosure. They are bent from a displaying and light-emitting surface to a backside of the light-emitting surface. An area of a bezel region of the display panel can be narrowed, so as to obtain an effect of bezel-free and narrow-bezel.

A tiled display panel according to the present disclosure is formed by tiling the above-mentioned bezel-free display panel or narrow-bezel display panel. Seams can be narrowed to a size of one-pixel unit, so as to make the seams difficult to be recognized by naked eyes to users and obtain an effect of eliminating or reducing seams.

According to the manufacturing method of a display panel according to one embodiment of the present discourse, by disposing the fanout circuit and the fanout circuit base layer on the surface of the array substrate and forming through-holes in the fanout circuit base layer and etching the metallic sacrificial layer between the fanout circuit base layer and the array substrate via the though-holes, the fanout circuit base layer and the array substrate can be easily separated without a step of laser lift-off. When the bonding of a driver chip is completed and the array substrate outside the bezel region is already cut off, the fanout circuit and the flexible fanout circuit base layer can be bent to a back of the display substrate. An area of the bezel region of the display panel can be narrowed, so as to obtain an effect of bezel-free and narrow-bezel.

BRIEF DESCRIPTION OF THE SEVERAL VIEWS OF THE DRAWINGS

In order to more clearly illustrate the technical solution of the present invention, a brief description of the drawings that are necessary for the illustration of the embodiments will be given as follows. Obviously, the drawings described below show only some embodiments of the present invention, and a person having ordinary skill in the art may also obtain other drawings based on the drawings described without making any creative effort.

DESCRIPTION OF SPECIFIC EMBODIMENTS OF THE INVENTION

The present disclosure is further described in detail below with reference to the accompanying drawings and embodiments. Obviously, the following described embodiments are only part of the present disclosure but not all. A person having ordinary skill in the art may obtain other embodiments based on the embodiments provided in the present disclosure without making any creative effort, which all belong to the scope of the present disclosure.

Figure 1:
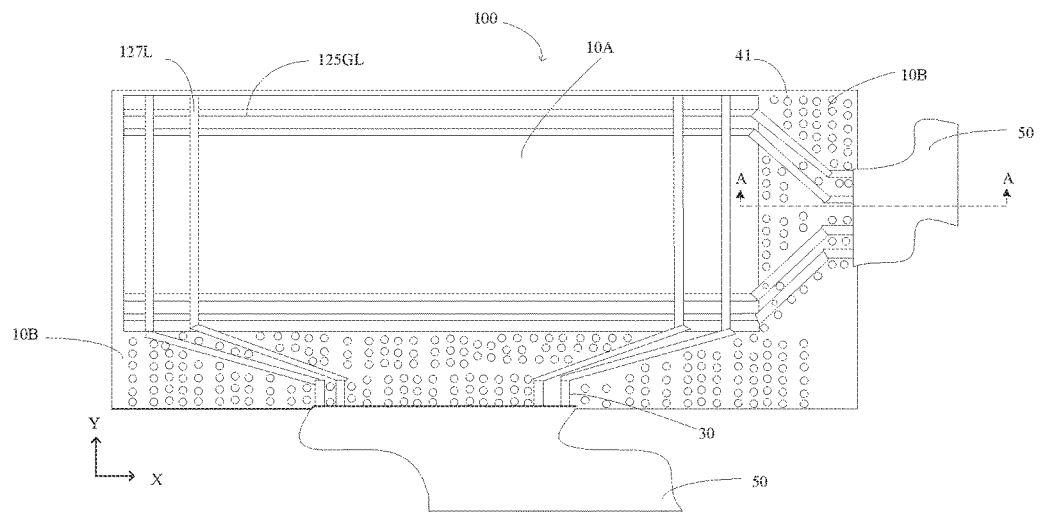
FIG. 1 is an unfolded schematic plan view of a display panel according to one embodiment of the present disclosure.
Figure 2:
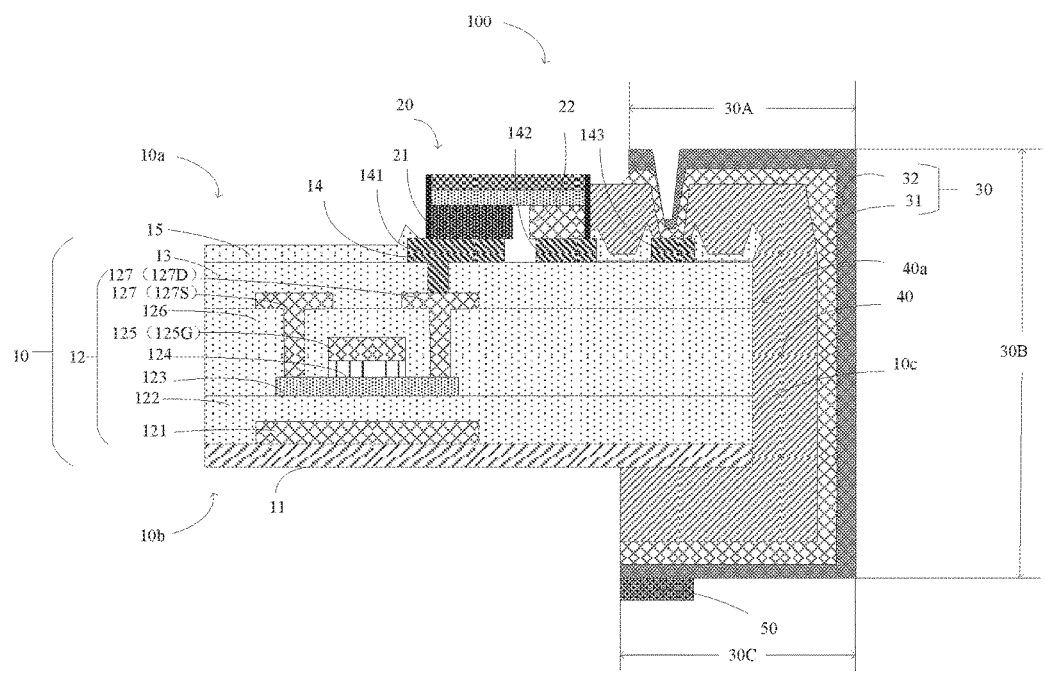
FIG. 2 is a cross-sectional view of the display panel of FIG. 1.

Please refer to FIG. 1 and FIG. 2, a display panel 100 according to one embodiment of the present disclosure comprises an array substrate 10, a light-emitting layer 20, a fanout circuit 30, a fanout circuit base layer 40, and a driver chip 50. The array substrate 10 comprises a display area 10A and a trace area 10B located around the display area 10A. The light-emitting layer 20 is located on the display area 10A and the light-emitting layer 20 is electrically connected to a first side 10a of the array substrate 10. The fanout circuit 30 is located on the trace area 10B. The fanout circuit base layer 40 is disposed between the fanout circuit 30 and the array substrate 10. The driver chip 50 is disposed at a second side 10b of the array substrate 10. The fanout circuit 30 and the fanout circuit base layer 40 are bent from the first side 10a to the second side 10b along a sidewall 10c of the array substrate 10. The fanout circuit 30 is electrically connected to the array substrate 10 at the first side 10b, and electrically connected to the driver chip 50 at the second side 10b.

The array substrate 10 comprises a base substrate 11, a thin film transistor layer 12, a first passivation layer 13, a pixel electrode layer 14, and a second passivation layer 15.

Specifically, the base substrate 11 is used to support other elements of the array substrate 10. For example, the base substrate 11 could be a plastic substrate or a glass substrate. In one embodiment of the present disclosure, the base substrate 11 could be a flexible substrate, for example, a polyimide substrate.

The thin film transistor layer 12 is located on the display area 10A and comprises a plurality of thin film transistors (TFTs) used for displaying. The thin film transistor layer 12 comprises a channel light-shielding layer 121, a buffer layer 122, a semiconductor layer 123, a gate insulating layer 124, a gate metal layer 125, an interlayer insulating layer 126, and a source drain metal layer 127 stacked on the base substrate 11.

The channel light-shielding layer 121 is disposed on the base substrate 11. The channel light-shielding layer 121 is used for light shielding a channel. The channel light-shielding layer 121 could be a metal with light shielding function, such as molybdenum (Mo), silver (Ag), aluminum (Al), molybdenum-copper (MoCu) alloy, a stack of molybdenum (Mo) and aluminum (Al), etc.

The buffer layer 122 covers the channel light-shielding layer 121 and the base substrate 11. The buffer layer 122 is used to prevent metals of the channel light-shielding layer 121 from diffusing into the semiconductor layer 123. The buffer layer 122 could be SiNx, SiOx, a stack of SiNx and SiOx, or a stack of AlOx and SiOx, etc.

The semiconductor layer 123 is disposed on the buffer layer 122. The semiconductor layer 123 is disposed corresponding to the channel light-shielding layer 121. The semiconductor layer 123 is a channel layer of the TFT. Oxide semiconductor materials, such as, indium zinc oxide (IZO), gallium indium oxide (IGO), indium gallium zinc oxide (IGZO), indium gallium tin oxide (IGTO), indium gallium zinc tin oxide (IGZTO), etc., can be applied as the semiconductor layer 123. Amorphous silicon, monocrystalline silicon, low-temperature polycrystalline silicon, etc., can also be applied as the semiconductor layer 123.

The gate insulating layer 124 covers the semiconductor layer 123. SiNx, SiOx, AlOx, a stack of SiNx and SiOx, or a stack of AlOx and SiOx, etc., can be applied as a material of the gate insulating layer 124.

The gate metal layer 125 is disposed on the gate insulating layer 124. The gate metal layer 125 comprises a gate electrode 125G and a gate line 125GL connected to the gate electrode 125G. The gate electrode 125G is disposed on the gate insulating layer 124. A plurality of gate lines 125GL are arranged in a first direction X in top view. A material of the gate metal layer 125 could be tantalum (Ta), tungsten (W), molybdenum (Mo), aluminum (Al), titanium (Ti), copper-niobium (CuNb) alloy, etc., or a stack of copper (Cu) and molybdenum (Mo), a stack of copper (Cu) and molybdenum-titanium (MoTi) alloy, a stack of copper (Cu) and titanium (Ti), a stack of aluminum (Al) and molybdenum (Mo), and a stack of molybdenum (Mo) and tantalum (Ta), a stack of molybdenum (Mo) and tungsten (W), a stack of molybdenum (Mo)-aluminum (Al)-molybdenum (Mo), etc.

The interlayer insulating layer 126 covers the buffer layer 122, the semiconductor layer 123 and the gate metal layer 125. For example, SiOx, a stack of SiNx and SiOx, etc., can be applied as the interlayer insulating layer 12.

The source drain metal layer 127 is disposed on the interlayer insulating layer 126. The source drain metal layer 127 comprises a source electrode 127S, a drain electrode 127D, and a source/drain line 127L connected to the source electrode 127S and the drain electrode 127D. The source electrode 127S and the drain electrode 127D are located at two opposite ends of the semiconductor layer 123. The source electrode 127S and the drain electrode 127D are connected with the semiconductor layer 123 by through-holes formed in the interlayer insulating layer 126 respectively. The gate electrode 125G and the gate insulating layer 124 are located between the source electrode 127S and the drain electrode 127D. When the TFT is turned on, current flows in the semiconductor layer 123 between the source electrode 127S and the drain electrode 127D. A plurality of source/drain lines 127L are arranged in a second direction Y. In one embodiment of the present disclosure, the first direction X and the second direction Y are perpendicular. The same material as the gate metal layer 125 can be applied as the source drain metal layer 127, for example, a stack of copper (Cu) and molybdenum (Mo), a stack of copper (Cu) and molybdenum-titanium (MoTi) alloy, a stack of copper (Cu) and titanium (Ti), a stack of aluminum (Al) and molybdenum (Mo), copper-niobium (CuNb) alloy, etc.

The passivation layer 13 is disposed on the thin film transistor layer 12 to flatten a surface of the thin film transistor layer 12. The same material as the above-mentioned insulating layers can be used as the passivation layer 13. For example, SiOx, a stack of SiNx and SiOx, etc.

The pixel electrode layer 14 is disposed on the passivation layer 13, and the pixel electrode layer 14 comprises a pixel electrode 141, a common electrode 142, and a connecting electrode 143. The pixel electrode 141 and the common electrode 142 are used to power the light-emitting layer 20 so as to control the light-emitting of the light-emitting layer 20. The pixel electrode 141 can be connected to one of the source electrode 127S and the drain electrode 127D. The common electrode 142 is provided with a common voltage. The connecting electrode 143 is used for electrically connecting the fanout circuit 13. The connecting electrode 143 is electrically connected to the common electrode 142. In one embodiment of the present disclosure, the connecting electrode 143 and the common electrode 142 are integrated, and it can be said that the connecting electrode is part of the common electrode 142. A material of the pixel electrode layer 14 could be a stack of molybdenum (Mo) and copper (Cu), a metal such as copper (Cu), or a transparent oxide.

The second passivation layer 15 covers the first passivation layer 13 and the pixel electrode layer 14. A plurality of openings are formed in the second passivation layer 15. The pixel electrode 141, the common electrode 142, and the connecting electrode 143 are exposed by the plurality of openings to electrically connect the light-emitting layer 20 and the fanout circuit 30.

In other embodiments of the present disclosure, the thin film transistor layer can be either a top gate type or a bottom gate type, the thin film transistor layer can also comprise two gates or two sets of source electrodes and drain electrodes.

In one embodiment of the present disclosure, the display panel 100 is a micro light-emitting diode (Micro LED) type display panel. The light-emitting layer 20 is a light-emitting element of a micro light-emitting diode. The light-emitting layer 20 comprises a first electrode 21, a second electrode 22, a pixel definition layer, and a micro light-emitting diode, a protection layer, etc., which are located in the pixel definition layer. The first electrode 21 and the second electrode 22 are respectively connected to the pixel electrode 141 and the common electrode 142. In one embodiment of the present disclosure, the electric potential of the pixel electrode 141 is positive. The pixel electrode 141 is electrically connected to the drain electrode 127D through a through-hole formed in the passivation layer. In other embodiments of the present disclosure, the electric potential of the pixel electrode 141 is negative. The pixel electrode 141 is electrically connected to the source electrode 127S through a through-hole formed in the passivation layer. According to differences in structures, micro light-emitting diode can be divided into vertically structural micro light-emitting diode and horizontally structural micro light-emitting diodes. The first electrode 21 and the second electrode 22 of the vertically structural micro light-emitting diode are located at an upper side and a lower side of the micro light-emitting diode, respectively. The first electrode 21 and the second electrode 22 of the horizontally structural micro light-emitting diode are both located at a lower side of the micro light-emitting diode. In the present embodiment, the micro light-emitting diode 20 is horizontally structural.

The fanout circuit 30 comprises a connecting portion 30A, a bending portion 30B, and a bonding portion 30C, which are sequentially connected. The connecting portion 30A is located at the first side 10a of the array substrate 10, and electrically connected to the connection electrode 143 to provide a voltage to the common electrode 142. In the present embodiment, the connecting portion 30A can be electrically connected to the common electrode 142 through an opening formed in the fanout circuit base layer 40. The bending portion 30B covers the sidewall 10C of the array substrate 10. The bonding portion 30C is located at the second side 10b of the array substrate 10, and the bonding portion 30C is bound with a driver chip 50.

In one embodiment of the present disclosure, the fanout circuit 30 includes a stack of a metal circuit layer 31 and a transparent circuit layer 32. A material of the metal circuit layer 31 can be a stack of molybdenum (Mo) and copper (Cu), or a stack of molybdenum-titanium (MoTi) alloy and Copper (Cu). A material of the transparent circuit layer 32 is ITO or IZO. In addition, although not shown in Figures, the fanout circuit 30 can be electrically connected to the source/drain line 127L through through-holes formed in the second passivation layer 15 and the first passivation layer 13, and electrically connected to the gate lines 125GL through through-holes formed in the interlayer insulating layer 126.

The fanout circuit base layer 40 is a flexible substrate, which can be defined as an organic flexible material, such as polyimide. At least one through-hole 41 is formed in the fanout circuit base layer 40.

The driver chip 50 can be in the form of chip on film (COF), that is, the driver chip 50 is disposed on the film and connected to the fanout circuit 30. The driver chip 30 can comprise a gate driver chip and a source/drain driver chip. The gate driver chip is connected to the gate lines 125GL. The source/drain driver chip is electrically connected to the source/drain lines 127L.

A fanout circuit and a fanout circuit base layer of a display panel are disposed on a surface of the array substrate according to one embodiment of the present disclosure. They are bent from a displaying and light-emitting surface to a backside of the light-emitting surface. An area of a bezel region of the display panel can be narrowed, so as to obtain an effect of bezel-free and narrow-bezel.

Please refer to FIG. 3(a) to FIG. 3(f), a manufacturing method of a display panel 100 is provided by the one embodiment of the present disclosure, comprising the steps of:

a fanout circuit forming step of providing an array substrate 10, wherein the array substrate 10 comprises a sacrificial metal layer 144, the array substrate 10 comprises a display area 10a and a trace area 10b located around the display area 10a, the sacrificial metal layer 144 is disposed on the trace area 10b in the array substrate 10, forming a fanout circuit base layer 40 on the trace area 100a at a first side 10a of the array substrate 10, and forming a fanout circuit 30 on the fanout circuit base layer 40;

a sacrificial layer removing step of etching and removing the sacrificial metal layer 144;

a light-emitting layer and diver chip bonding step of bonding a light-emitting layer 20 at the first side 10a, wherein the light-emitting layer 20 is electrically connected to the array substrate 10, and bonding a driver chip 50 to a bonding portion 30c;

a substrate cutting step of cutting off a portion of the array substrate 10 which is located under the bending portion 30b; and a fanout circuit bending step of bending the fanout circuit 30, the fanout circuit base layer 40, and the driver chip 50 to a second side 10b of the array substrate 10.

In the fanout circuit forming step, the array substrate 10 comprises a base substrate 11, a thin film transistor layer 12, a first passivation layer 13, a pixel electrode layer 14, and a second passivation layer 15. The sacrificial metal layer is comprised in the pixel electrode layer 14.

Figure 3A:
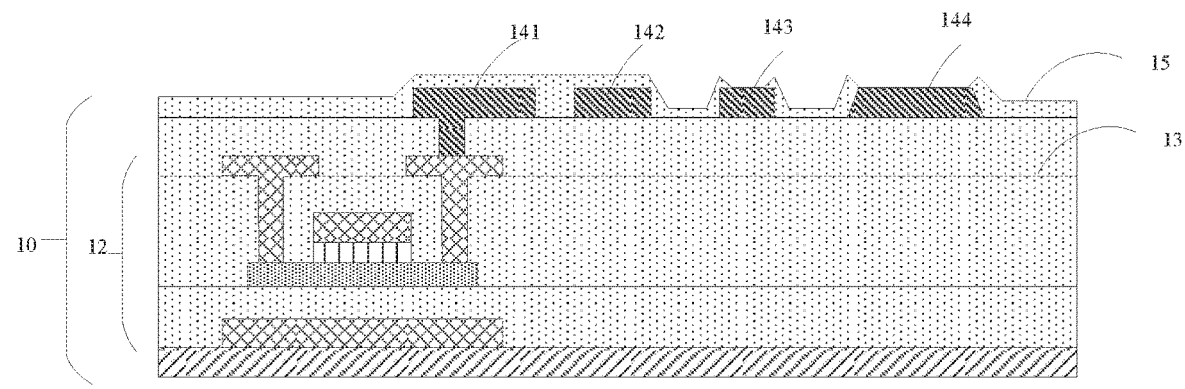
FIG. 3(a) to FIG. 3(f) is a schematic view of a manufacturing method of a display panel according to one embodiment of the present disclosure.
Figure 3B:
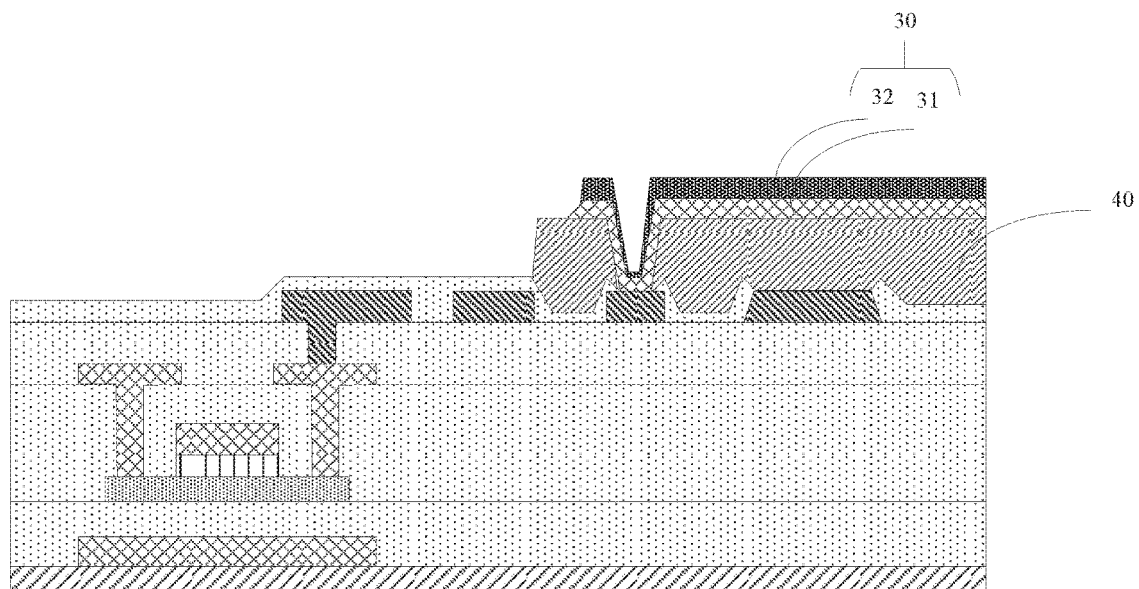

Please refer to FIG. 3(a) to FIG. 3(b), the step of forming the fanout circuit 30 on the fanout circuit base layer 40 comprises a step of:

forming a fanout circuit base layer 40 on a non-display area of the array substrate 10. The fanout circuit substrate 40 is formed by coating and patterning organic materials on the array substrate 10. At least one through-hole 41 (please refer to FIG. 1) is formed on the fanout circuit base layer 40. The through-hole 41 is located above the sacrificial metal layer 144, and the through-hole 41 is connected with the sacrificial metal layer 144 for subsequent etching of the sacrificial metal layer 144. In this step, a through-hole can also be formed above the connecting electrode 143 to expose the connecting electrode 143 for electrically connecting the fanout circuit 30.

The fanout circuit 30 can be formed on the fanout circuit base layer 40 by processes of deposition, exposure, development, or etching. Specifically, the fanout circuit 30 comprises a patterned metal circuit layer 31 and a patterned transparent circuit layer 32. The metal circuit layer 31 is electrically connected with the transparent circuit layer 32 to form the fanout circuit 30.

Figure 3C:
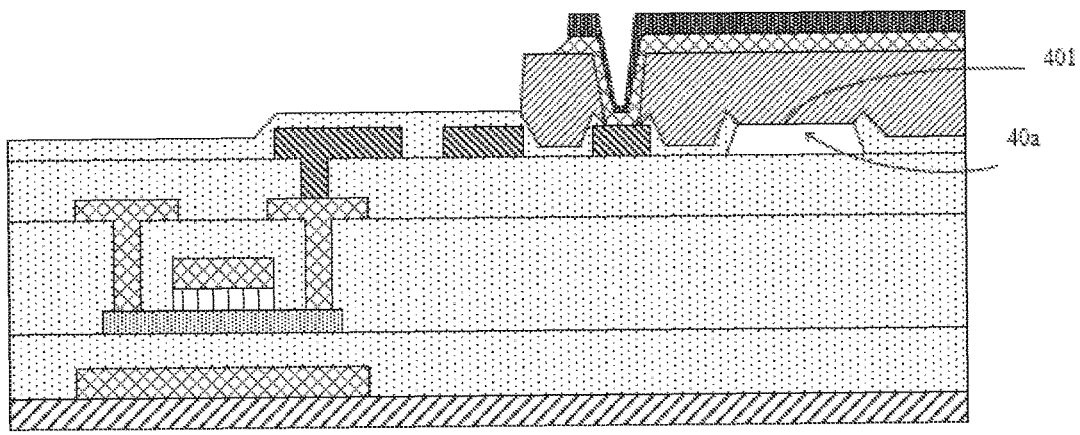

Please refer to FIG. 3(c), the sacrificial metal layer removing step comprises the following steps of: removing the sacrificial metal layer 144 by etching via the through-hole 41, and forming a groove 40a at the original position of the sacrificial metal layer 144 for subsequent cutting of the array substrate 10. The sacrificial metal layer removing step can be conducted simultaneously with the patterning of the fanout circuit 30.

Figure 3D:
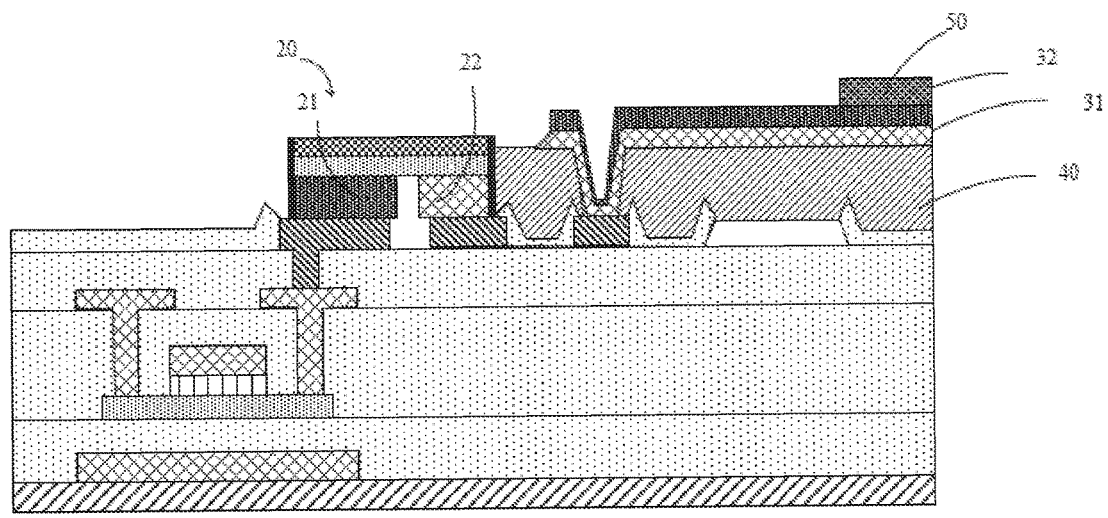

Please refer to FIG. 3(d), the light-emitting layer and driver chip bonding step comprises the following steps of: etching to remove the second passivation layer 15 located above the pixel electrode 141 and the common electrode 142, wherein the light-emitting layer 20 is formed by micro LED transfer on the pixel electrode 141 and the common electrode 142, The light-emitting layer 20 is a light-emitting element of a micro light-emitting diode. The light-emitting layer 20 comprises a first electrode 21, a second electrode 22, a pixel definition layer, and a micro light-emitting diode, a protection layer, etc., which are located in the pixel definition layer. The first electrode 21 is connected to the pixel electrode 141, the second electrode 22 is connected to the common electrode 142, and bonding the driver chip 50 at the bonding portion 30C of the fanout circuit 30.

Figure 3E:
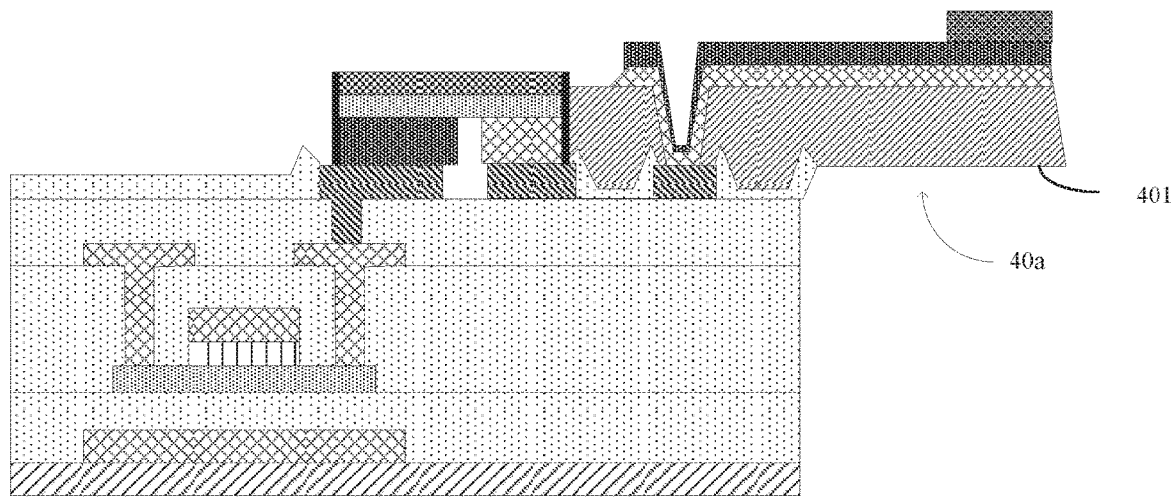

Please refer to FIG. 3(e), a substrate cutting step of cutting off a portion of the array substrate 10 which is located under the bending portion 30B so that the fanout circuit 30 and 40 can be bent freely.

Figure 3F:
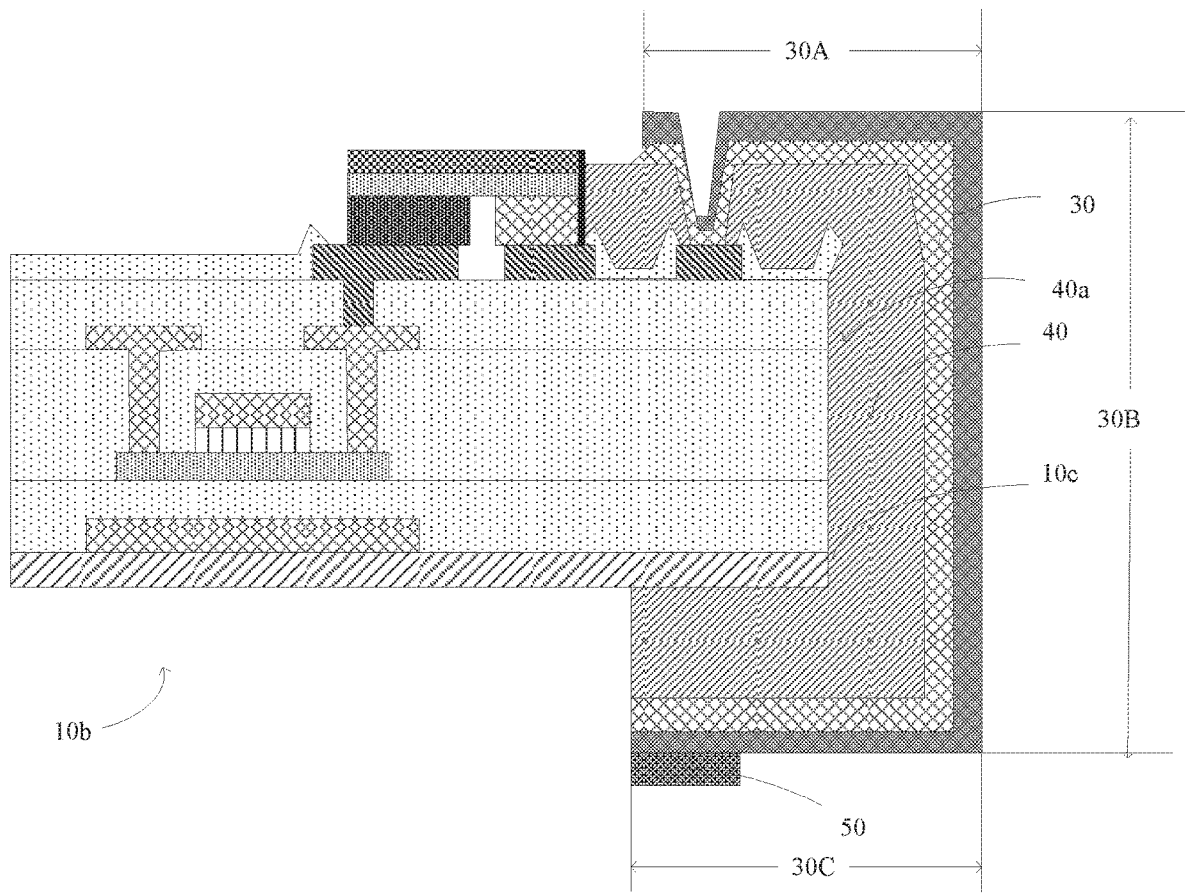
Figure 4A:
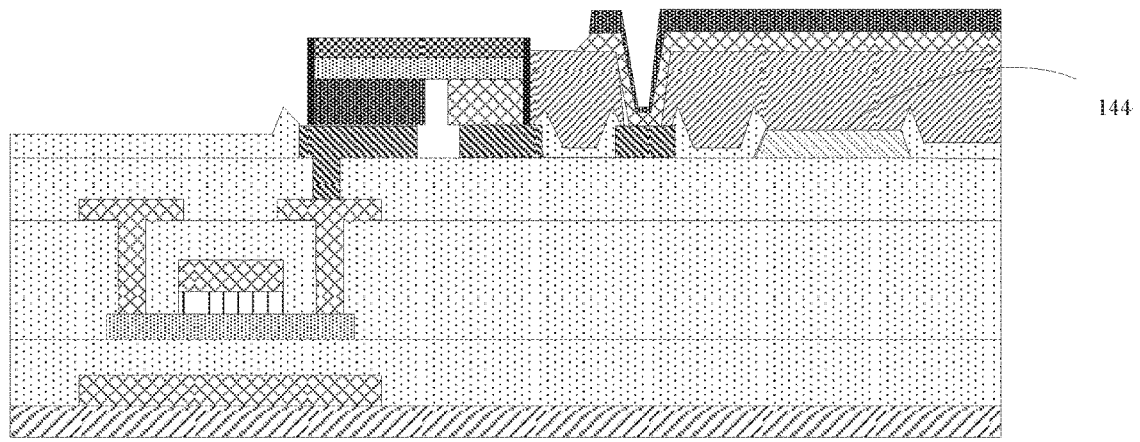
FIG. 4(a) to FIG. 4(d) is a schematic view of some steps of a manufacturing method of a display panel according to another embodiment of the present disclosure.
Figure 4B:
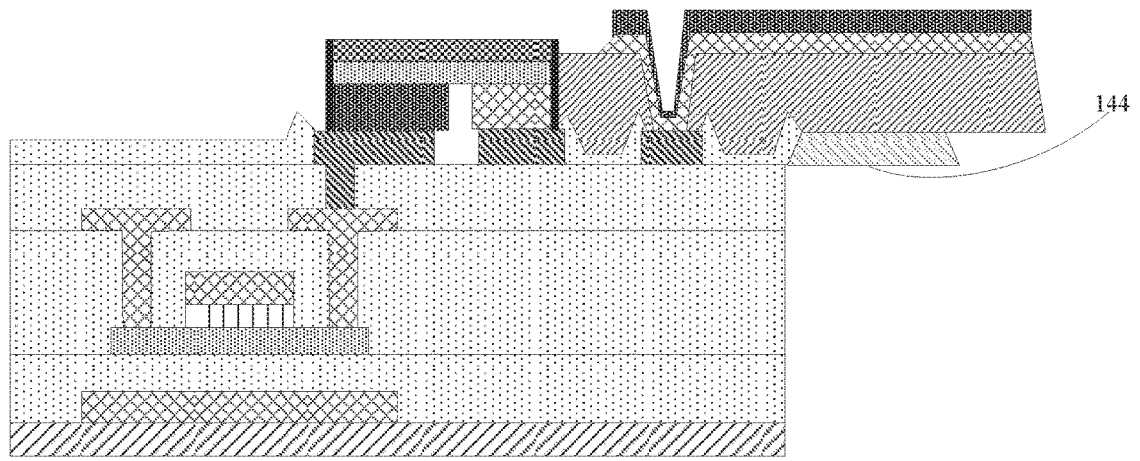
Figure 4C:
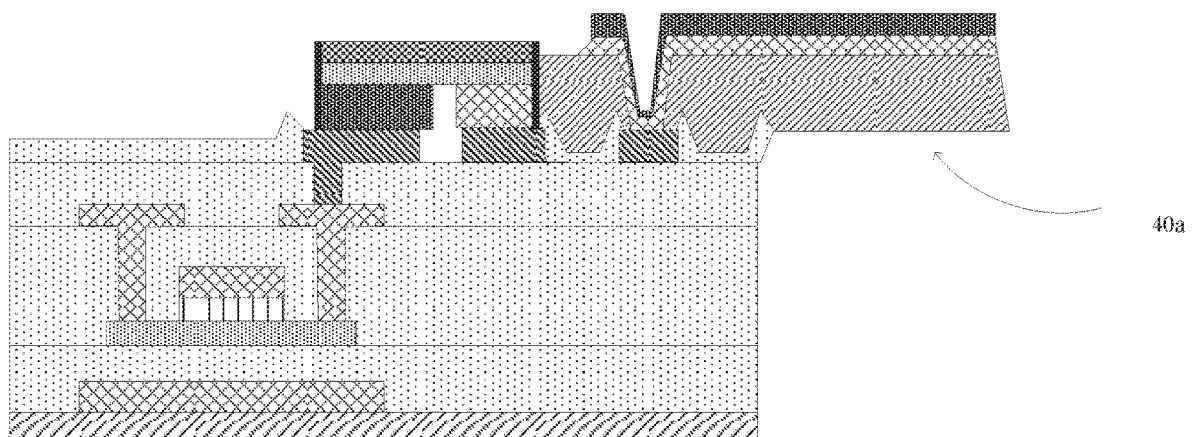
Figure 4D:
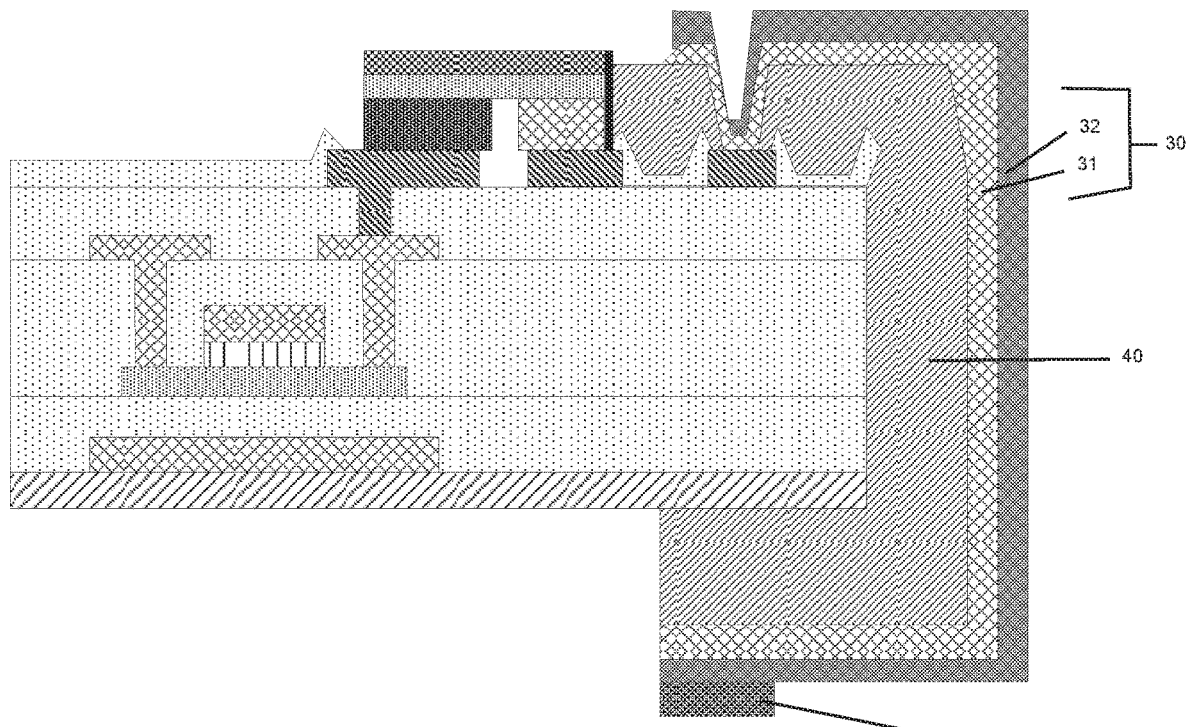

Please refer to FIG. 3(f), in the fanout circuit bending step, after the encapsulation of the light-emitting layer 20 is completed, the fanout circuit 30 and the fanout circuit base layer 40 are bent to cover the sidewall 10C of the array substrate 10. The fanout circuit 30 comprises a connecting portion 30A, a bending portion 30B, and a bonding portion 30C, which are sequentially connected. The connecting portion 30A is electrically connected to the array substrate 10, and the bending portion 30b is covered by the sacrificial metal layer 144.

Please refer to FIG. 4 (a) to FIG. 4 (d), a manufacturing method of a display panel in another embodiment of the present disclosure is basically the same as the above-mentioned manufacturing method, except that: the substrate cutting step is conducted before the sacrificial metal layer removing step, the sacrificial metal layer 144 is exposed in the substrate cutting step, and the sacrificial metal layer is removed by etching to form a groove 40a in the sacrificial metal layer removing step, after that, a bending of the fanout circuit 30, the fanout circuit base layer 40, and the driver chip 50 is conducted.

According to the manufacturing method of a display panel according to one embodiment of the present discourse, by disposing the fanout circuit and the fanout circuit base layer on the surface of the array substrate and forming through-holes in the fanout circuit base layer and etching the metallic sacrificial layer between the fanout circuit base layer and the array substrate via the though-holes, the fanout circuit base layer and the array substrate can be easily separated without a step of laser lift-off. When the bonding of a driver chip is completed and the array substrate outside the bezel region is already cut off, the fanout circuit and the flexible fanout circuit base layer can be bent to a back of the display substrate. An area of the bezel region of the display panel can be narrowed, so as to obtain an effect of bezel-free and narrow-bezel.

Figure 5:
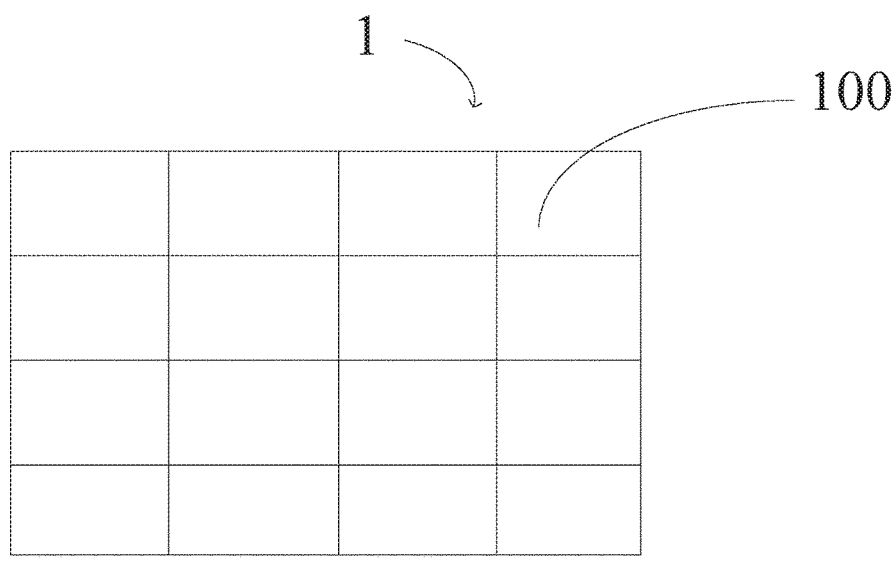
FIG. 5 is a schematic plan view of a tiled display panel according to one embodiment of the present disclosure.

Please refer to FIG. 5, a tiled display panel 1 according to the present disclosure is formed by tiling a plurality of the above-mentioned bezel-free display panels or narrow-bezel display panels 100, and the plurality of display panels are tightly arranged in a matrix. Seams can be narrowed to a size of one-pixel unit by means of the tiled display panel 1, so as to make the seams difficult to be recognized by the naked eye by users and obtain an effect of eliminating or reducing seams.

The above description provides a detailed introduction to the application. In this disclosure, specific examples are applied to explain principle and embodiments of the application. The description of the above embodiments is only used to help understand the application. At the same time, for those skilled in the art, according to the thought of the present disclosure, there will be changes in the specific embodiments and application scope. In conclusion, the content of the specification should not be understood as the limitation of the application.

A detailed description of a display panel and a manufacturing method of the display panel provided by embodiments of the present disclosure is illustrated above. The description of the above embodiments is only intended to help understand the technical schemes and core concepts of the present disclosure. It is noted that those with ordinary skill in the field could make various modifications to the technical schemes described in embodiments above-mentioned, and these modifications and replacements do not make the essence of the corresponding technical schemes depart from the scope of technical schemes of embodiments of the present disclosure.

What is claimed is:

1. A display panel, comprising:
  an array substrate comprising a display area and a trace area located around the display area, wherein the array substrate comprises:
    a base substrate;
    a thin film transistor layer located on the base substrate; and
    a pixel electrode layer disposed on the thin film transistor layer, wherein the pixel electrode layer comprises a pixel electrode, a common electrode, and a connecting electrode, the common electrode is electrically connected to the connecting electrode, and the pixel electrode is electrically connected to the thin film transistor layer;
  a light-emitting layer located in the display area and electrically connected to a first side of the array substrate, wherein the light-emitting layer is located on the pixel electrode layer and electrically connected to the pixel electrode and the common electrode;
  a fanout circuit located in the trace area, wherein the fanout circuit is located on the pixel electrode layer, and the fanout circuit comprises a connecting portion, a bending portion, and a bonding portion;
  a fanout circuit base layer disposed between the fanout circuit and the array substrate; and
  a driver chip located at a second side of the array substrate;
  wherein the fanout circuit and the fanout circuit base layer are bent from the first side to the second side along a sidewall of the array substrate, the connecting portion is located at the first side and electrically connected to the connecting electrode, the bending portion covers the sidewall of the array substrate, and the bonding portion is located at the second side and is electrically connected to the driver chip.

2. The display panel of claim 1, wherein the thin film transistor layer comprises a plurality of thin film transistors, a plurality of gate lines connecting to a gate electrode of the plurality of thin film transistors, and a plurality of source/drain lines connecting to a source/drain electrode of the plurality of thin film transistors, wherein the connecting electrode is electrically connected to the gate lines and the source/drain lines.

3. The display panel of claim 2, wherein the pixel electrode is electrically connected to the source electrode or the drain electrode of the thin film transistors.

4. The display panel of claim 1, wherein at least one through-hole is formed on the fanout circuit base layer.

5. The display panel of claim 1, wherein the light-emitting layer comprises a micro light-emitting diode.

6. A manufacturing method of a display panel, comprising the steps of:
- a fanout circuit forming step of providing an array substrate, forming a fanout circuit base layer at a first side of the array substrate, and forming a fanout circuit on the fanout circuit base layer, wherein the array substrate comprises:
  - a base substrate;
  - a thin film transistor layer located on the base substrate;
  - a pixel electrode layer disposed on the thin film transistor layer, wherein the pixel electrode layer comprises a pixel electrode, a common electrode, and a connecting electrode, the common electrode is electrically connected to the connecting electrode, and the pixel electrode is electrically connected to the thin film transistor layer; and
  - a sacrificial metal layer, the sacrificial metal layer is disposed on a trace area of the array substrate;
- the fanout circuit comprises a connecting portion, a bending portion, and a bonding portion;
- a sacrificial layer removing step of etching and removing the sacrificial metal layer;
- a light-emitting layer and diver chip bonding step of bonding the light-emitting layer on the first side, and bonding the driver chip to the bonding portion, wherein the light-emitting layer and the fanout circuit are located on the pixel electrode layer, the light-emitting layer is electrically connected to the pixel electrode and the common electrode;
- a substrate cutting step of cutting off a portion of the array substrate which is located under the bending portion; and
- a fanout circuit bending step of bending the fanout circuit base layer, the fanout circuit, and the driver chip to a second side of the array substrate, the connecting portion is located at the first side and electrically connected to the connecting electrode, the bending portion covers the sidewall of the array substrate, and the bonding portion is located at the second side and is electrically connected to the driver chip.

7. The manufacturing method of claim 6, wherein the fanout circuit forming step comprises a step of forming at least one through-hole on the fanout circuit base layer, and the sacrificial metal layer removing step comprises a step of etching the sacrificial metal layer via the through-hole.

8. The manufacturing method of claim 6, wherein the substrate cutting step is before the sacrificial metal layer removing step, the sacrificial metal layer is exposed by the substrate cutting step, and the metal layer is removed by the sacrificial metal layer removing step.

9. A tiled display panel having a plurality of display panels, wherein the plurality of display panels are arranged in a matrix, the display panel comprising:
- an array substrate comprising a display area and a trace area located around the display area, wherein the array substrate comprises:
  - a base substrate;
  - a thin film transistor layer located on the base substrate; and
  - a pixel electrode layer disposed on the thin film transistor layer, wherein the pixel electrode layer comprises a pixel electrode, a common electrode, and a connecting electrode, the common electrode is electrically connected to the connecting electrode, and the pixel electrode is electrically connected to the thin film transistor layer;
- a light-emitting layer located in the display area and electrically connected to a first side of the array substrate, wherein the light-emitting layer is located on the pixel electrode layer and electrically connected to the pixel electrode and the common electrode;
- a fanout circuit located in the trace area, wherein the fanout circuit is located on the pixel electrode layer, and the fanout circuit comprises a connecting portion, a bending portion, and a bonding portion;
- a fanout circuit base layer disposed between the fanout circuit and the array substrate; and
- a driver chip located at a second side of the array substrate;
- wherein the fanout circuit and the fanout circuit base layer are bent from the first side to the second side along a sidewall of the array substrate, the connecting portion of the fanout circuit is located at the first side and electrically connected to the connecting electrode, the bending portion covers a sidewall of the array substrate, and the bonding portion is located at the second side and is electrically connected to the driver chip.

10. The tiled display panel of claim 9, wherein the thin film transistor layer comprises a plurality of thin film transistors, a plurality of gate lines connecting to a gate electrode of the plurality of thin film transistors, and a plurality of source/drain lines connecting to a source/drain electrode of the plurality of thin film transistors, wherein the connecting electrode is electrically connected to the gate lines and the source/drain lines.

11. The tiled display panel of claim 10, wherein the pixel electrode is electrically connected to the source electrode or the drain electrode of the thin film transistor layer.

12. The tiled display panel of claim 9, wherein at least one through-hole is formed on the fanout circuit base layer.

* * * * *